United States Patent
Usami

(10) Patent No.: US 9,087,710 B2
(45) Date of Patent: *Jul. 21, 2015

(54) SEMICONDUCTOR DEVICE WITH STACKED SEMICONDUCTOR CHIPS

(75) Inventor: Toshihiko Usami, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 40 days.

This patent is subject to a terminal disclaimer.

(21) Appl. No.: 13/462,499

(22) Filed: May 2, 2012

(65) Prior Publication Data

US 2012/0211875 A1  Aug. 23, 2012

Related U.S. Application Data

(63) Continuation of application No. 12/693,921, filed on Jan. 26, 2010, now Pat. No. 8,198,718.

(30) Foreign Application Priority Data

Feb. 25, 2009  (JP) ................. 2009-042309

(51) Int. Cl.
*H01L 23/556* (2006.01)
*H01L 25/065* (2006.01)
(Continued)

(52) U.S. Cl.
CPC .......... *H01L 25/0657* (2013.01); *H01L 23/552* (2013.01); *H01L 24/48* (2013.01); *H01L 2224/32145* (2013.01); *H01L 2224/48095* (2013.01); *H01L 2224/48227* (2013.01); *H01L 2224/73265* (2013.01); *H01L 2225/0651* (2013.01); *H01L 2225/06527* (2013.01); *H01L 2225/06575* (2013.01); *H01L 2924/01079* (2013.01); *H01L 2924/07802* (2013.01); *H01L 2924/10253* (2013.01); *H01L 2924/15311* (2013.01); *H01L 2924/19107* (2013.01); *H01L 2924/3011* (2013.01); *H01L 2924/3025* (2013.01)

(58) Field of Classification Search
CPC .............. H01L 23/552; H01L 25/0657; H01L 2924/10253; H01L 2224/32145; H01L 2224/48095; H01L 2224/48227; H01L 2224/73265; H01L 2225/0651; H01L 24/48
USPC ........ 257/686, 685, 723, 724, 728, 777, 659, 257/E23.129, E23.145, 784, 786, 698, 257/E23.142, E25.003, E23.115, E23.114, 257/E21.504, 660, 692
See application file for complete search history.

(56) References Cited

U.S. PATENT DOCUMENTS

| | | | |
|---|---|---|---|
| 6,650,009 B2 * | 11/2003 | Her et al. | 257/686 |
| 6,680,529 B2 * | 1/2004 | Chen et al. | 257/700 |
| 6,734,539 B2 * | 5/2004 | Degani et al. | 257/686 |

(Continued)

FOREIGN PATENT DOCUMENTS

| | | |
|---|---|---|
| JP | 2000-269411 A | 9/2000 |
| JP | 2004-111656 A | 4/2004 |

(Continued)

*Primary Examiner* — Alexander Oscar Williams

(57) ABSTRACT

A semiconductor device includes first to third semiconductor chips. The second semiconductor chip is stacked over the first semiconductor chip. The third semiconductor chip is stacked over the second semiconductor chip. The second semiconductor chip shields the first semiconductor chip from noises generated by the third semiconductor chip. The second semiconductor chip shields the third semiconductor chip from noises generated by the first semiconductor chip.

21 Claims, 2 Drawing Sheets

(51) Int. Cl.
*H01L 23/552* (2006.01)
*H01L 23/00* (2006.01)

(56) References Cited

U.S. PATENT DOCUMENTS

| | | | |
|---|---|---|---|
| 7,176,506 B2 * | 2/2007 | Beroz et al. | 257/232 |
| 7,456,495 B2 * | 11/2008 | Pohl et al. | 257/686 |
| 8,110,441 B2 * | 2/2012 | Chandra et al. | 438/113 |
| 8,198,718 B2 * | 6/2012 | Usami | 257/686 |
| 8,344,490 B2 * | 1/2013 | Aiba et al. | 257/686 |
| 8,373,559 B2 * | 2/2013 | McCain | 340/540 |
| 8,405,197 B2 * | 3/2013 | Ha et al. | 257/686 |
| 8,610,271 B2 * | 12/2013 | Perng et al. | 257/738 |
| 2003/0157747 A1 * | 8/2003 | Chen et al. | 438/106 |
| 2004/0051170 A1 | 3/2004 | Kawakami et al. | |
| 2005/0133932 A1 * | 6/2005 | Pohl et al. | 257/777 |
| 2005/0194673 A1 * | 9/2005 | Kwon et al. | 257/686 |
| 2006/0170084 A1 | 8/2006 | Masuda et al. | |
| 2007/0096160 A1 * | 5/2007 | Beroz et al. | 257/232 |
| 2007/0296087 A1 | 12/2007 | Ogata et al. | |
| 2008/0174001 A1 | 7/2008 | Aiba et al. | |
| 2008/0178463 A1 | 7/2008 | Okubora | |
| 2008/0258259 A1 * | 10/2008 | Osaka et al. | 257/532 |
| 2008/0315376 A1 | 12/2008 | Tang et al. | |
| 2008/0315404 A1 | 12/2008 | Eichelberger et al. | |
| 2009/0206455 A1 * | 8/2009 | Harper et al. | 257/659 |
| 2010/0019359 A1 * | 1/2010 | Pagaila et al. | 257/659 |
| 2010/0244193 A1 * | 9/2010 | Lin et al. | 257/532 |
| 2011/0127671 A1 | 6/2011 | Yoshikawa et al. | |
| 2011/0147899 A1 * | 6/2011 | Dahilig et al. | 257/622 |
| 2011/0227234 A1 * | 9/2011 | Nishizawa et al. | 257/784 |
| 2011/0316117 A1 * | 12/2011 | Kripesh et al. | 257/531 |
| 2014/0073089 A1 * | 3/2014 | Perng et al. | 438/107 |

FOREIGN PATENT DOCUMENTS

| | | |
|---|---|---|
| JP | 2005-303056 A | 10/2005 |
| JP | 2006-041019 A | 2/2006 |
| JP | 2006-186053 A | 7/2006 |
| JP | 2006-310800 A | 11/2006 |
| JP | 2007-227414 A | 9/2007 |
| JP | 2008-091395 A | 4/2008 |

* cited by examiner

SEMICONDUCTOR DEVICE WITH STACKED SEMICONDUCTOR CHIPS

CROSS-REFERENCE TO RELATED PATENT APPLICATIONS

Japan Priority Application Number 2009-042309, filed Feb. 25, 2009 including the specification, drawings, claims and abstract, is incorporated herein by reference in its entirety. This application is a Continuation of U.S. application Ser. No. 12/693,921, filed Jan. 26, 2010, now U.S. Pat. No. 8,148,804, incorporated herein by reference in its entirety.

BACKGROUND OF THE INVENTION

1. Field of the Invention

The present invention relates to a semiconductor device.

2. Description of the Related Art

Recently, demands for high-density semiconductor devices have been increasing with the introduction of IT and the diffusion of mobile devices. Therefore, miniaturization of BGA (Ball Grid Array) semiconductor devices and MCP (Multi Chip Packaging) for packaging multiple stacked semiconductor chips have progressed.

For example, Japanese Patent Laid-Open Publication Nos. 2007-227414 and 2004-111656 disclose BGA semiconductor devices. FIG. 4 illustrates an example of such a BGA semiconductor device.

A BGA semiconductor device 1 shown in FIG. 4 includes: a wiring board 2 having an upper surface 2a with multiple connection pads 3a, 3b, and 3c thereon and a lower surface 2b with multiple lands 4 thereon electrically connected to the respective connection pads 3a, 3b, and 3c; a first semiconductor chip 6 over the surface 2a of the wiring board 2; a spacer 7 stacked over the first semiconductor chip 6; a third semiconductor chip 8 stacked over the spacer 7; a second semiconductor chip 9 stacked over the third semiconductor chip 8; wires 11a, 11b, and 11c; a seal 12 made of an insulating resin covering at least the semiconductor chips 6, 8, and 9, and the wires 11a, 11b, and 11c; and external terminals 5 that are solder balls or the like on the lands 4.

The wiring board 2 is substantially rectangular in plane view (i.e., when viewed in a direction perpendicular to the surfaces 2a and 2b thereof). The wiring board 2 is, for example, a glass epoxy board having a thickness of, for example, 0.25 mm. Wirings (not shown) are provided on both surfaces of the glass epoxy board. The wirings are covered by a solder resist film 14 that is an insulating film having multiple openings (not shown).

The connection pads 3a, 3b, and 3c are provided on the wirings that are on the surface 2a of the wiring board 2 and exposed through the openings of the solder resist film 14. The lands 4 are provided on the wirings that are on the surface 2b of the wiring board 2 and exposed through the openings of the solder resist film 14. The lands 4 are made of, for example, a Cu material, Ni, or Au plating.

The connection pads 3a, 3b, and 3c are electrically connected to the corresponding lands 4 through internal wires 15, penetrating via holes, or the like in the wiring board 2. The lands 4 are arranged in a grid on the surface 2b of the wiring board 2 at a predetermined interval, such as the interval of 0.5 mm.

The first semiconductor chip 6 is disposed over substantially the center of the surface 2a of the wiring board 2 through a fixing member 13, such as an insulating adhesive or a DAF (Die Attached Film). The first semiconductor chip 6 is substantially rectangular in plane view. A predetermined circuit, such as a logic circuit or a memory circuit, is formed on a surface 6a of the first semiconductor chip 6.

Multiple first electrode pads 10a are aligned along sides of the surface 6a of the first semiconductor chip 6. A passivation film (not shown) covers the surface 6a of the first semiconductor chip 6 excluding regions of the first electrode pads 10a to protect the circuit formation surface.

The first electrodes pads 10a on the first semiconductor chip 6 are electrically connected to the corresponding connection pads 3a on the wiring board 2 through the conductive wires 11a made of, for example, Au or Cu. Thus, the first semiconductor chip 6 is electrically connected to the lands 4 through the wires 11a, the connection pads 3a, and the internal wires 15.

The spacer 7 is stacked over the first semiconductor chip 6 through the insulating fixing member 13. The third semiconductor chip 8 is stacked over the spacer 7 through the insulating fixing member 13.

Multiple third electrode pads 10c are aligned along sides of an upper surface 8a of the third semiconductor chip 8. A passivation film (not shown) covers the surface 8a of the third semiconductor chip 8 excluding regions of the third electrode pads 10c to protect the circuit formation surface.

The third electrode pads 10c on the third semiconductor chip 8 are electrically connected to the corresponding connection pads 3c on the wiring board 2 through the conductive wires 11c.

The second semiconductor chip 9 is stacked over the third semiconductor chip 8 through the insulating fixing member 13. Multiple second electrode pads 10b are aligned along sides of an upper surface 9a of the second semiconductor chip 9. A passivation film (not shown) covers the surface 9a of the second semiconductor chip 9 excluding regions of the second electrode pads 10b to protect the circuit formation surface.

The second electrodes pads 10b on the second semiconductor chip 9 are electrically connected to the corresponding connection pads 3b on the wiring board 2 through the conductive wires 11b.

The seal 12 covers substantially the entire surface 2a of the wiring board 2 so as to cover the semiconductor chips 6, 8, and 9, and the wires 11a, 11b, and 11c. The seal 12 is made of a thermosetting resin, such as an epoxy resin. The seal 12 has a thickness of approximately 400 μm.

As the external terminals 5, solder balls that are bumps are mounted in a grid on the corresponding lands 4 on the surface 2b of the wiring board 2.

Recently, demands for packaging a radio frequency (RF) chip together with a memory chip and a logic chip have been increasing with the progress of BGA semiconductor devices having a multi-chip packaging structure.

The radio frequency chip is likely to generate high frequency noises outside the chip compared to other semiconductor chips. Additionally, the radio frequency chip is likely to malfunction if subjected to radio frequency noises or noises caused by a power source variation. The memory chip consumes much current in a wiring operation, and therefore noises caused by a power source variation are likely to be generated.

FIG. 3 illustrates variations in voltages of a power source and the ground of the memory chip. As understood from FIG. 3, the power source in the memory chip and the potential of the ground are not stable in an actual operation, thereby causing a variation in voltage if a large amount of current flows in a memory writing process or in an output switching process.

To reduce the variation in voltage and to prevent malfunction of the chip, it is effective to reduce impedance of the power source or the ground. As general countermeasures, the widths of wirings of the power source and the ground are increased to increase capacity. Additionally, multiple wiring paths are provided to reduce the resistance. Alternatively, a decoupling capacitor for preventing power noises is inserted.

However, these countermeasures cannot be taken for high-density semiconductor devices. To package the radio frequency chip together with the memory chip and the like, the effects of radio frequency noises have to be prevented. For this reason, various countermeasures, such as an increase in distance among chips, and design and preproduction of shields and substrate wirings, are required so as not to cause characteristic defects.

Further, various countermeasures for reducing impedance are required so as to prevent noises caused by a power source variation. However, no effective countermeasure has been proposed.

SUMMARY OF THE INVENTION

In one embodiment, a semiconductor device includes first to third semiconductor chips. The second semiconductor chip is stacked over the first semiconductor chip. The third semiconductor chip is stacked over the second semiconductor chip. The second semiconductor chip shields the first semiconductor chip from noises generated by the third semiconductor chip. The second semiconductor chip shields the third semiconductor chip from noises generated by the first semiconductor chip.

Accordingly, noises generated by the first semiconductor chip and noises generated by the third semiconductor chip can be prevented from affecting each other.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. The accompanying drawings explain a semiconductor device in the embodiments. The size, the thickness, and the like of each illustrated portion might be different from those of each portion of an actual semiconductor device.

Those skilled in the art will recognize that many alternative embodiments can be accomplished using the teaching of the present invention and that the invention is not limited to the embodiments illustrated for explanatory purpose.

Figure 1:
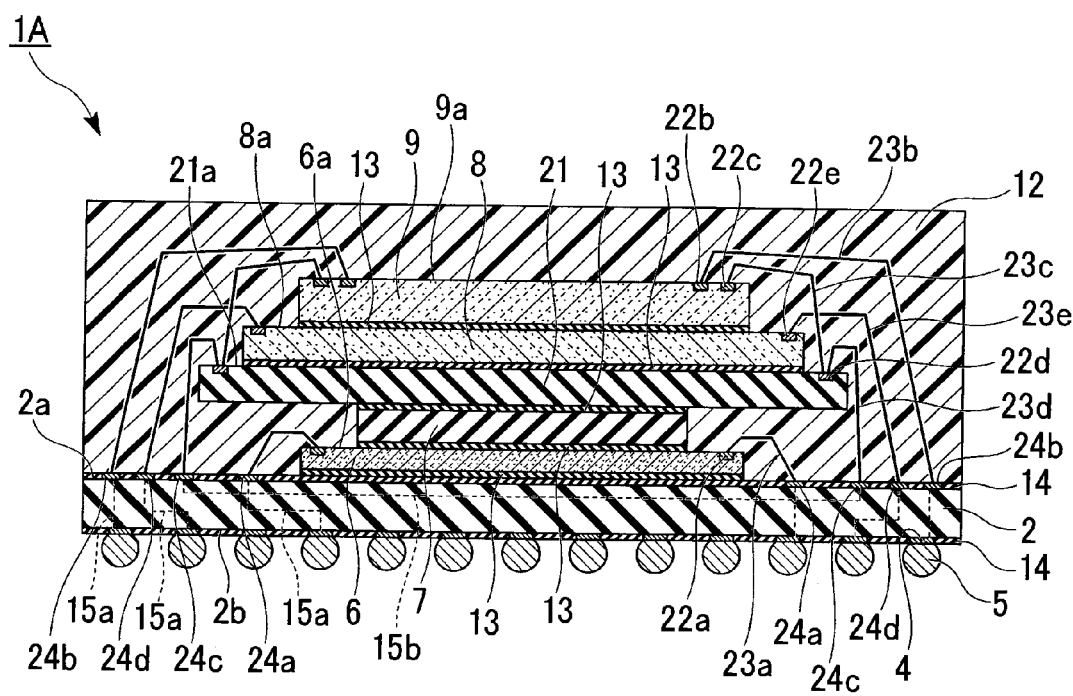
FIG. 1 is a cross-sectional view illustrating a semiconductor device according to a first embodiment of the present invention.
Figure 2:
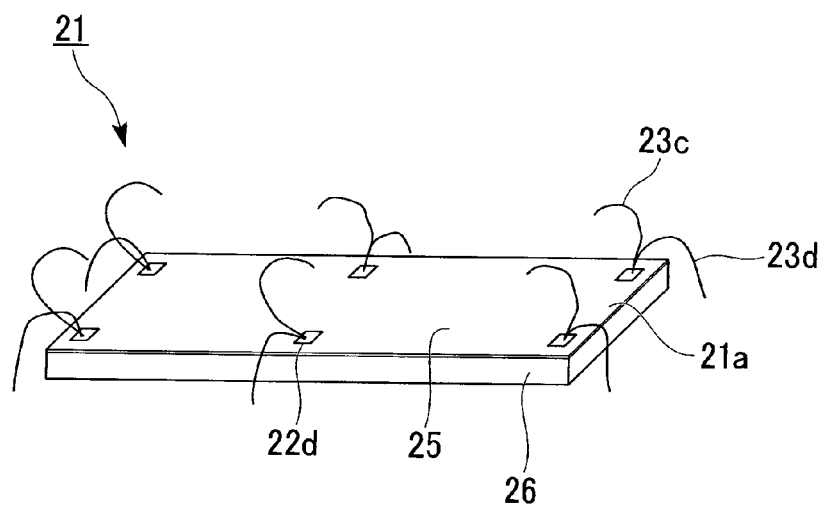
FIG. 2 is an oblique view illustrating a conductive coating chip included in the semiconductor device.
Figure 3:
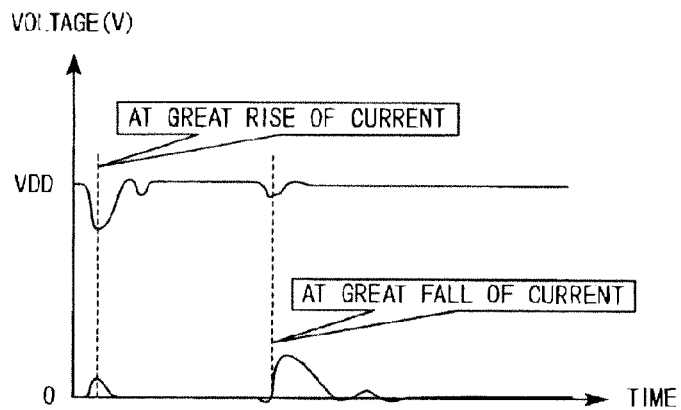
FIG. 3 is a graph illustrating variations in voltages of a power source and the ground of a memory chip.
Figure 4:
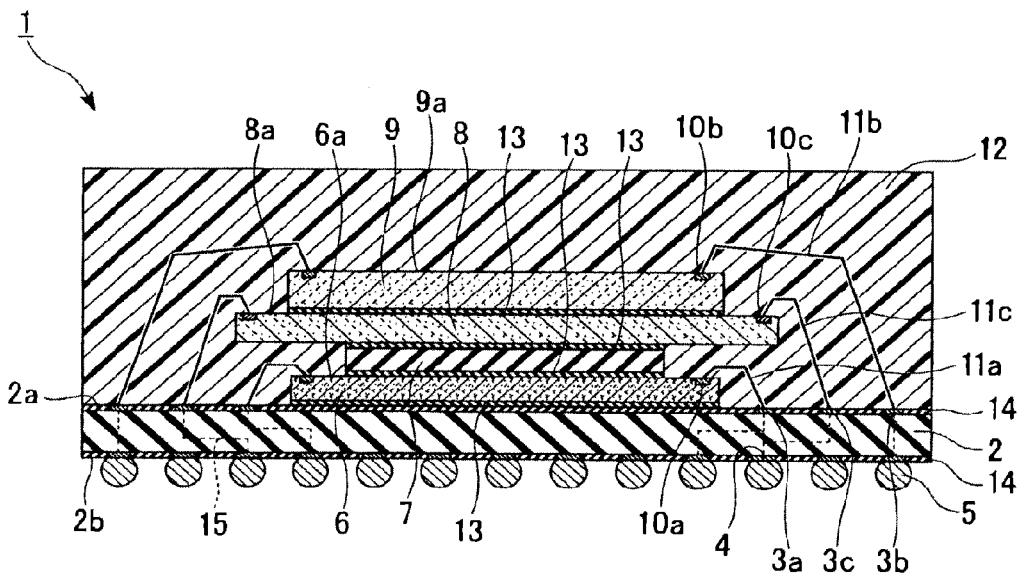
FIG. 4 is a cross-sectional view illustrating a BGA semiconductor device of a related art.

FIG. 1 is a cross-sectional view illustrating a semiconductor device 1A according to a first embodiment of the present invention. FIG. 2 is an oblique view illustrating a conductive coating chip included in the semiconductor device 1A.

The semiconductor device 1A includes: a wiring board 2 having an upper surface 2a with multiple connection pads 24a, 24b, 24c, and 24d thereon and a lower surface 2b with multiple lands 4 thereon electrically connected to the respective connection pads 24a, 24b, 24c, and 24d; a first semiconductor chip 6 over the surface 2a of the wiring board 2; a spacer 7 stacked over the first semiconductor chip 6; a conductive coating chip 21 stacked over the spacer 7; a third semiconductor chip 8 stacked over the conductive coating chip 21; a second semiconductor chip 9 stacked over the third semiconductor chip 8; wires 23a, 23b, 23c, 23d, and 23e; a seal 12 made of an insulating resin covering at least the semiconductor chips 6, 8, and 9, the conductive coating chip 21, and the wires 23a, 23b, 23c, 23d, and 23e; and external terminals 5 that are solder balls or the like on the lands 4. The connection pads 24c are not electrically connected to the lands 4.

The wiring board 2 is substantially rectangular in plane view (i.e., when viewed in a direction perpendicular to the surfaces 2a and 2b thereof). The wiring board 2 is, for example, a glass epoxy board having a thickness of, for example, 0.25 mm. Wirings (not shown) are provided on both surfaces of the glass epoxy board. The wirings are covered by a solder resist film 14 that is an insulating film having multiple openings (not shown).

The connection pads 24a, 24b, 24c, and 24d are provided on the wirings that are on the surface 2a of the wiring board 2 and exposed through the openings of the solder resist film 14. The lands 4 are provided on the wirings that are on the surface 2b of the wiring board 2 and exposed through the openings of the solder resist film 14. The lands 4 are made of, for example, a Cu material, Ni, or Au plating.

The connection pads 24a, 24b, and 24d are electrically connected to the corresponding lands 4 through internal wires 15a, penetrating via holes, or the like in the wiring board 2. The connection pads 24c are electrically connected to each other through internal wires 15b in the wiring board 2. The lands 4 are arranged in a grid on the surface 2b of the wiring board 2 at a predetermined interval, such as an interval of 0.5 mm.

The first semiconductor chip 6 is disposed over substantially the center of the surface 2a of the wiring board 2 through a fixing member 13, such as an insulating adhesive or a DAF (Die Attached Film). The first semiconductor chip 6 is substantially rectangular in plane view. A predetermined circuit, such as a logic circuit or a memory circuit, is formed on a surface 6a of the first semiconductor chip 6.

Multiple first electrode pads 22a are aligned along sides of the surface 6a of the first semiconductor chip 6. A passivation film (not shown) covers the surface 6a of the first semiconductor chip 6 excluding regions of the first electrode pads 22a to protect the circuit formulation surface.

The first electrode pads 22a on the first semiconductor chip 6 are electrically connected to the corresponding first connection pads 24a on the wiring board 2 through the first conductive wires 23a made of, for example, Au or Cu.

Thus, the first semiconductor chip 6 is electrically connected to the lands 4 through the first wires 23a, the first connection pads 24a, and the internal wires 15a. In the first embodiment, a radio frequency chip is used as the first semiconductor chip 6.

The spacer 7 is stacked over the first semiconductor chip 6 through the insulating fixing member 13. The conductive coating chip 21 is stacked over the spacer 7 through the insulating fixing member 13.

The conductive chip 21 is larger in area than the first to third semiconductor chips 6, 9, and 8 in plane view. In other words, the outer edge of the conductive chip 21 is outside outer edges of the first to third semiconductor chips 6, 9, and 8 in plane view.

According to this structure, the conductive coating chip 21 functions as a shield, thereby shielding against strong direct radio frequency noises and electromagnetic noises generated between the first semiconductor chip 6 and the second and third semiconductor chips 9 and 8.

As shown in FIG. 2, the conductive coating chip 21 includes a silicon chip 26 and a conductor 25. The conductor 25 is, for example, Al, and coats a surface 21a of the conductive coating chip 21.

Multiple fourth electrode pads 22d are aligned along sides of the surface 21a of the conductive coating chip 21. Third and fourth wires 23c and 23d are connected to the fourth electrode pads 22d.

The third semiconductor chip 8 is stacked over the conductive coating chip 21 through the insulating fixing member 13. Multiple fifth electrode pads 22e are aligned along sides of an upper surface 8a of the third semiconductor chip 8. A passivation film (not shown) covers the surface 8a of the third semiconductor chip 8 excluding regions of the fifth electrode pads 22e to protect the circuit formation surface.

The fifth electrode pads 22e on the third semiconductor chip 8 are electrically connected to the corresponding fourth connection pads 24d on the wiring board 2 through the fifth conductive wires 23e.

Thus, the third semiconductor chip 8 is electrically connected to the lands 4 through the fifth wires 23e, the fourth connection pads 24d, and the internal wires 15a. A DRAM memory chip is used as the third semiconductor chip 8 in the first embodiment.

The second semiconductor chip 9 is stacked over the third semiconductor chip 8 through the insulating fixing member 13. Multiple second and third electrode pads 22b and 22c are aligned along sides of an upper surface 9a of the second semiconductor chip 9. A passivation film (not shown) covers the surface 9a of the second semiconductor chip 9 excluding regions of the second and third electrode pads 22b and 22c to protect the circuit formation surface.

The second electrode pads 22b on the second semiconductor chip 9 are electrically connected to the corresponding second connection pads 24b on the wiring board 2 through the second conductive wires 23b.

Thus, the second semiconductor chip 9 is electrically connected to the lands 4 through the second wires 23b, the second connection pads 24b, and the internal wires 15a. In the first embodiment, a logic chip is used as the second semiconductor chip 9.

The third electrode pads 22c on the second semiconductor chip 9 are electrically connected to the corresponding fourth electrode pads 22d on the conductive coating chip 21 through third wires 23c. The fourth electrode pads 22d on the conductive coating chip 21 are electrically connected to the corresponding third connection pads 24c on the wiring board 2 through fourth wires 23d.

Thus, the conductive coating chip 21, the second semiconductor chip 9 that is the voltage variation source, and the wiring board 2 that is the ground are connected through the short wires 23c and 23d, thereby enabling a reduction in impedance. Additionally, the conductor 25 coats the surface 21a of the conductive coating chip 21, thereby increasing the electric capacity of the conductive coating chip 21, and therefore shielding against noise caused by a variation in voltage.

The seal 12 covers substantially the entire surface 2a of the wiring board 2 so as to cover the semiconductor chips 6, 8, and 9, the conductive coating chip 21, and the wires 23a, 23b, 23c, 23d, and 23e. The seal 12 is made of a thermosetting resin, such as an epoxy resin. The seal 12 has a thickness of approximately 400 µm.

As the external terminals 5, solder balls that are bumps are mounted in a grid on the corresponding lands 4 on the surface 2b of the wiring board 2.

According to the first embodiment, the conductive coating chip 21 between the first semiconductor chip 6 that is the radio frequency chip and a set of the second and third semiconductor chips 9 and 8 functions as a shield.

Therefore, strong radio frequency noises and electromagnetic noises generated between the first semiconductor chip 6 and a set of the second and third semiconductor chips 9 and 8 can be shielded.

Consequently, radio frequency noises generated by the first semiconductor chip 6 and radio frequency noises generated by the second and third semiconductor chips 9 and 8 are prevented from affecting each other.

Additionally, the conductive coating chip 21 is larger in size than the semiconductor chips 6, 8, and 9 in plane view, thereby enhancing the shielding function of the conductive coating chip 21.

Consequently, radio frequency noises generated by the first semiconductor chip 6 and radio frequency noises generated by the second and third semiconductor chips 9 and 8 are prevented from affecting each other.

Further, the conductive coating chip 21 is electrically connected, through the wires 23c, to the second semiconductor chip 9 that is a memory chip as a source of a variation in voltage, thereby reducing impedance, and therefore preventing noises causing a variation in voltage.

Moreover, the conductive coating chip 21 is electrically connected to the wiring board 2 through the wires 23d, thereby reducing impedance and therefore preventing noises causing a variation in voltage.

It is apparent that the present invention is not limited to the above embodiments, but may be modified and changed without departing from the scope and spirit of the invention.

For example, although the three semiconductor chips are stacked in the first embodiment, more semiconductor chips may be stacked through more spacers. The present invention is widely applicable to semiconductor-device manufacturing industries.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

What is claimed is:
1. A semiconductor device comprising:
a radio frequency chip including a main surface and a side surface defining an edge thereof;
a spacer stacked on the main surface of the radio frequency chip;

a conductive coating chip stacked on the spacer, the conductive coating chip including a first main surface and a second main surface opposite to the first main surface, the first main surface including one or more electrode pads disposed along a side, the second main surface facing down to the main surface of the radio frequency chip; and
a first semiconductor chip stacked over the conductive coating chip, the conductive coating chip being disposed between the radio frequency chip and the first semiconductor chip.

2. The semiconductor device according to claim 1, wherein the first main surface includes a conductive layer the conductive layer shielding one of the radio frequency chip and the logic chip from a noise generated by the other of the radio frequency chip and the first semiconductor chip.

3. The semiconductor device according to claim 1, wherein the conductive coating chip is larger in size than at least one of the radio frequency chip and the first semiconductor chip.

4. The semiconductor device according to claim 1, further comprising:
a first insulating adhesive provided between the radio frequency chip and the conductive coating chip; and
a second insulating adhesive provided between the conductive coating chip and the first semiconductor chip.

5. The semiconductor device according to claim 1, further comprising:
a wiring board having a first surface and second surface opposite to the first surface, the radio frequency chip stacking on the first surface of the wiring board, a plurality of external terminals disposed on the second surface of the wiring board, the plurality of external terminals being electrically coupled to at least one of the radio frequency chip and the semiconductor chip.

6. The semiconductor device according to claim 1, further comprising:
a second semiconductor chip provided between the conductive coating chip and the first semiconductor chip, wherein the first semiconductor is a logic chip, and the second semiconductor chip is a memory chip.

7. The semiconductor device according to claim 5, further comprising:
a seal provided over the wiring board to cover the radio frequency chip, the conductive coating chip and the first semiconductor chip.

8. A semiconductor device comprising:
a wiring board including a first surface and a second surface opposite to the first surface;
a radio frequency chip mounted over the first surface of the wiring board, the radio frequency chip including a main surface and a side surface defining an edge thereof;
a spacer stacked on the main surface of the radio frequency chip;
a conductive coating chip on the spacer, the conductive coating chip including an upper surface and a lower surface opposite to the upper surface, the upper surface including one or more electrode pads disposed along a side, the lower surface facing down to the main surface of the radio frequency chip;
a logic chip stacked over the conductive coating chip, the conductive coating chip being disposed between the radio frequency chip and the logic chip; and
an external terminal provided under the second surface of the wiring board, the external terminal being electrically coupled to at least one of the radio frequency chip and the logic chip.

9. The semiconductor device according to claim 8, wherein the conductive coating chip is shielding one of the radio frequency chip and the logic chip from a noise generated by the other of the radio frequency chip and the logic chip.

10. The semiconductor device according to claim 8, wherein the conductive coating chip is larger in size than at least one of the radio frequency chip and the logic chip.

11. The semiconductor device according to claim 8, further comprising:
a first insulating adhesive provided between the radio frequency chip and the conductive coating chip; and
a second insulating adhesive provided between the conductive coating chip and the logic chip.

12. The semiconductor device according to claim 8, further comprising:
a bonding wire electrically coupling the one or more electrode pads on the conductive coating chip to the logic chip.

13. The semiconductor device according to claim 8, further comprising:
a memory chip provided between the conductive coating chip and the logic chip.

14. The semiconductor device according to claim 8, further comprising:
a seal provided over the wiring board to cover the radio frequency chip, the conductive coating chip and the logic chip.

15. A semiconductor device comprising:
a wiring board;
a radio frequency chip mounted over the wiring board;
a spacer stacked on a surface of the radio frequency chip;
a silicon substrate including a first and a second main surfaces opposite to each other and a conductive layer formed on the first main surface, the silicon substrate being stacked over the radio frequency chip so that the second main surface faces the radio frequency chip;
one or more electrode pads disposed on the conductive layer along a side of the silicon substrate;
a logic chip stacked over the silicon substrate, the silicon substrate being disposed between the radio frequency chip and the logic chip; and
an external terminal provided under the wiring board, the external terminal being electrically coupled to at least one of the radio frequency chip and the logic chip.

16. The semiconductor device according to claim 15, wherein the conductive layer of the silicon substrate is shielding one of the radio frequency chip and the logic chip from a noise generated by the other of the radio frequency chip and the logic chip.

17. The semiconductor device according to claim 15, wherein the silicon substrate is larger in size than at least one of the radio frequency chip and the logic chip.

18. The semiconductor device according to claim 15, further comprising:
a first insulating adhesive provided between the radio frequency chip and the silicon substrate; and
a second insulating adhesive provided between the silicon substrate and the logic chip.

19. The semiconductor device according to claim 15, further comprising:
a memory chip provided between the conductive layer and the logic chip.

20. The semiconductor device according to claim 1, wherein the conductive coating chip includes no electronic devices, and wherein the semiconductor chip is electrically connected to the one or more electrode pads on the conductive coating chip through one or more wires.

21. The semiconductor device according to claim 15, wherein the silicon substrate includes no electronic devices, and wherein the logic chip is electrically connected to the silicon substrate at the one or more electrode pads on the conductive layer through one or more wires.

\* \* \* \* \*